June 15, 1965 R. E. MENTZER 3,188,871

TUNING DEVICE

Filed Feb. 25, 1963 3 Sheets-Sheet 1

INVENTOR
ROBERT E. MENTZER
BY Stanley H. Zeglen
ATTORNEY

INVENTOR.
ROBERT E. MENTZER
BY Stanley H. Zeyher
ATTORNEY

INVENTOR.
ROBERT E. MENTZER
BY Stanley H. Zaylor
ATTORNEY

United States Patent Office 3,188,871
Patented June 15, 1965

3,188,871

TUNING DEVICE

Robert E. Mentzer, Southampton, Pa., assignor to Philco Corporation, Philadelphia, Pa., a corporation of Delaware Filed Feb. 25, 1963, Ser. No. 260,426
7 Claims. (Cl. 74—10)

This invention relates to mechanism for precisely adjusting a shaft, and more particularly to novel and improved tuning mechanism for achieving presettable fine tuning.

The mechanism comprising this invention constitutes an external control mechanism for use with tuners, and devices of similar nature, requiring precise presettable adjustment. By way of illustration and not of limitation the invention will be illustrated and described in connection with its use with UHF tuners.

The allocation by the Federal Communications Commission of seventy UHF channels covering the Americas, and the advent of more recent rulings aimed at re-allocating present VHF channels as UHF channels, has made it increasingly desirable, from the standpoint of both convenience and economy, to provide a single tuning mechanism by means of which a tuner of the continuously tunable type may be presettably indexed to any of the large number of channels (presently seventy) lying within the assigned UHF band of from 470 to 890 megacycles.

One difficulty in achieving this end by mechanical means, utilizing prior art techniques, is the large amount of space required for its accomplishment. The problem of achieving presettable fine tuning of a large number of channels in a reasonably compact space is compounded by the further desired requirements that the system be both fine tunable by the operator in a presettable manner, and be capable of utilizing for example a conventional variable air condenser or a variable inductance having a limited tuning range, typically 180° of arc. A still further requirement is that maximum permissible channel misalignment is of the order of approximately 150 kilocycles equivalent to a repeatability tolerance factor of about .06° of arc. It will be seen that the provision of such a tuning device presents a problem of considerable magnitude, from both the standpoint of size and of precision of adjustment required to effect acceptable tuning.

It is accordingly an object of this invention to provide compact tuning mechanism capable of achieving detented channel selection and presettable fine tuning of a plurality of closely adjacent broadcast stations.

Another object of the invention is to provide tuning mechanism which is compact, inexpensive and simple in construction and one which permits manual return to preselected stations with a high degree of precision and reliability.

A still further object of the invention is to provide a detented UHF tuning device having a single knob control for both coarse alignment and fine tuning adjustment.

These and other objects and features of the present invention will be apparent from a consideration of the following detailed description taken in conjunction with the accompanying drawings, in which.

The invention in its more limited aspect relates to tuning mechanism adapted for use with a conventional UHF tuner, constructed and arranged to permit detented channel selection and presettable fine tuning thereof.

Figures 1, 2:
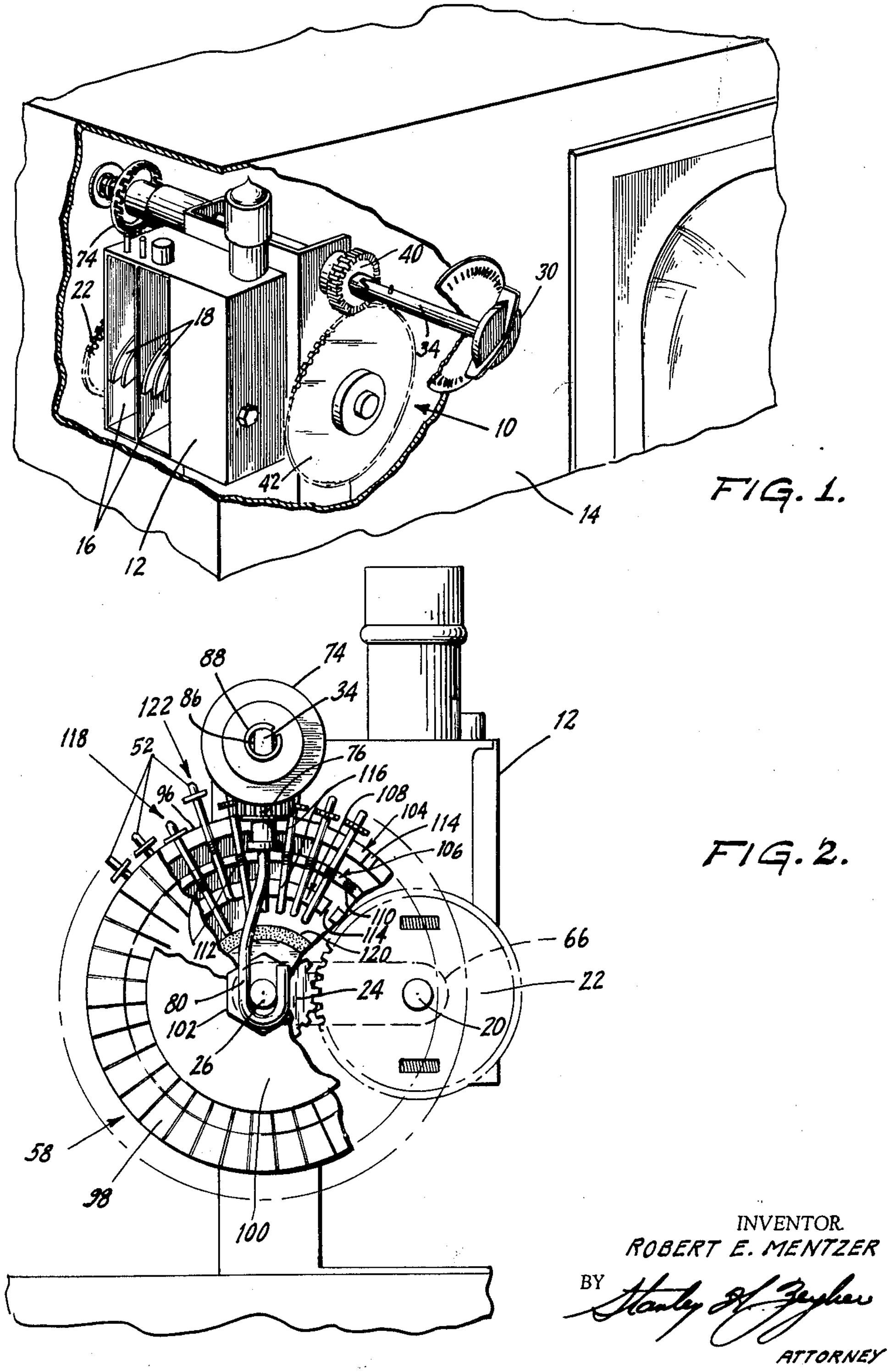
FIGURE 1 is a partially cut-away perspective of a television receiver embodying tuning mechanism of the present invention.
FIGURES 2 and 3 are, respectively, end and side elevational views of the tuning mechanism shown in FIGURE 1.
Figure 3:
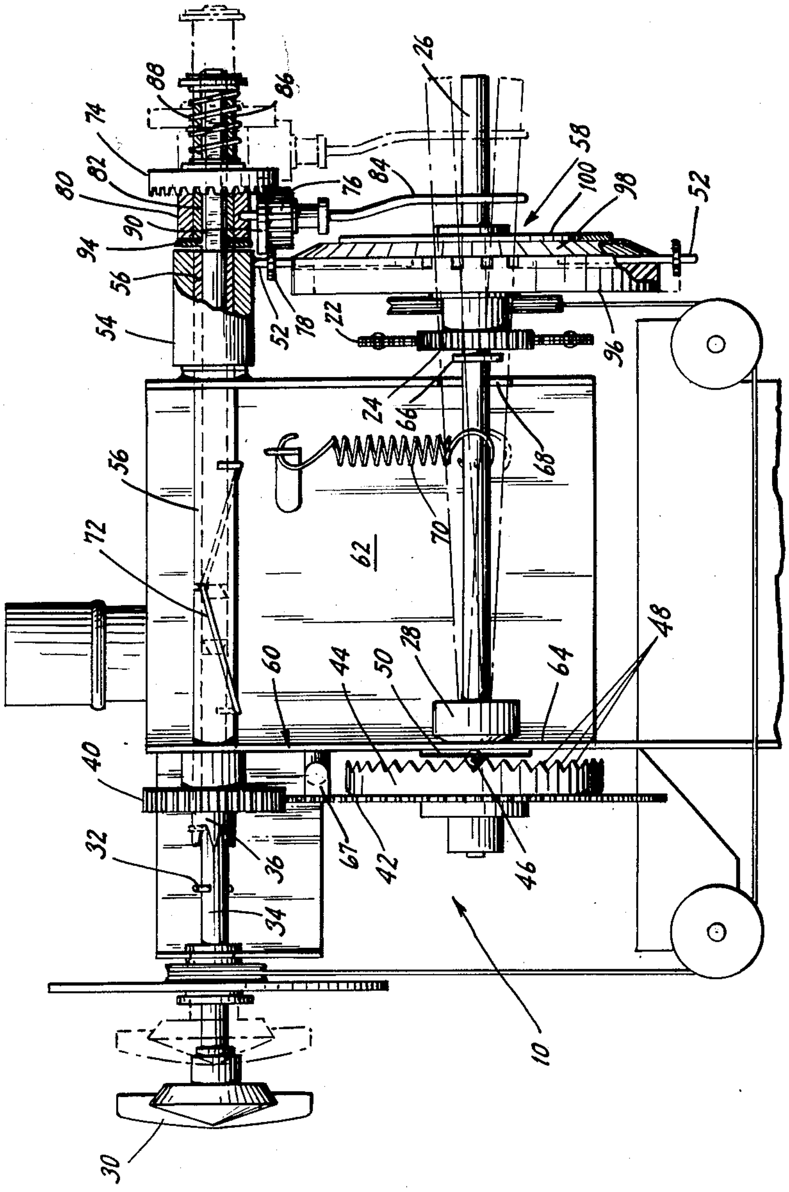

Referring to FIGURE 1, the tuning mechanism is generally indicated by the numeral 10 and is shown adapted for use with a conventional UHF tuner 12 incorporated in a console type television receiver 14. Details of the mechanism's construction are shown in FIGURES 2 and 3. Tuner 12 is of the type which is continuously variable over its tunable range and is illustrated as consisting of a plurality of variable condenser units 16 the rotating plates 18 of which are carried on a common rotatable shaft 20 (FIGURE 2). In accordance with the invention the tuner shaft 20 has fixedly secured thereto an anti-backlash gear 22 adapted for detented and micrometric adjustment by means hereinafter described. The angular position of shaft 20 determines the UHF channel being received.

In operation the anti-backlash gear 22 is rotated by the tuning gear 24 carried by control shaft 26. This shaft, unlike conventional drive means, has two modes of movement, being adapted for both conventional rotational movement about its longitudinal axis and tilting movement about the tilt bearing 28 as seen in FIGURE 3. In accordance with the invention both these movements are mechanically translated, into angular displacement of the tuner shaft 20 to provide for both the coarse and fine tuning adjustments.

The control shaft 26 is conditioned for rotational movement by translating control knob 30 into its fully seated position, as shown in dashed lines in FIGURE 3, placing pin 32 carried by the operating shaft 34 in engagement with pin clutch 36. With the mechanism in this position rotational movement of knob 30 is transmitted from the coarse tuning drive gear 40 through the detent gear 42 to tuning gear 24. Secured to gear 42 for rotation therewith is a crown detent plate 44. This plate, acting in cooperation with the spring loaded ball detent 46, provides detented 10° incremental rotation of control shaft 26. The detent plate is not a precision part since its function is only to provide positions which are repeatable with accuracy, not spaced with accuracy. The teeth 48 are blunted slightly to reduce wear. The ball 46 may be rigidly attached to a flat detent spring 50 or alternatively may be positioned within an undersized hole provided in the face of the spring. If this latter construction is employed the ball-hole diameter is critical, in that too large a hole will allow the ball eventually to be hammered through the spring, and if too small the ball cannot be retained in its seat. One satisfactory arrangement, using a .156" diameter steel ball, is to use a retaining hole of .154" diameter. In the present embodiment, the detent plate 44 is provided with 35 serrations providing 35 detented channel selections. Each detent station is provided with a micrometrically adjustable tuning slug 2 which is brought into contact with the bottom of a roller 54, carried by a countershaft 56 engageable by the shaft 34, as the ball 46 bottoms in the serration associated with that particular tuning slug, all as best seen in FIGURE 3. To provide smoother mating between the roller 54 and tuning slugs 52, the roller is mounted for rotation with the countershaft 56. This construction insures movement of the slugs and roller in the same direction, and permits running contact to be made between the two mating surfaces to facilitate their engagement. By this arrangement, and through the driving contact of gear 24 with tuner drive gear 22, tuner 12 is coarsely tuned to a position nominally lying within a three channel span. Fine tuning of the selected channel is next accomplished by maintaining the control shaft 26 detentably locked in its coarse tuned position against further rotation, while tilting the shaft a prescribed amount, through adjustment of one of the slugs 52, to effect micrometric movement of the anti-backlash gear 22 and through that gear and tuner shaft 20 fine tuning of tuner 12. The constructional features for the accomplishment of this end are described in detail below.

As previously described the crown detent plate 44 is secured to one end of the control shaft 26 for rotation therewith and provides, in cooperation with the spring loaded ball 46, coarse, detent selection of 35 channels. The other end of the tuning shaft has the fine tuning slug wheel 58 attached to it, which wheel is mounted for rotation with the tuning shaft 26 and under control of the detent plate 44. Carried by the wheel 58 are 35 radially adjustable fine tuning slugs 52 spaced ten degrees apart around the periphery of the fine tuning slug wheel. Only two of these slugs are shown for simplicity of illustration. The slugs are aligned with respect to the detents in the detent plate so that each detent position is provided with an associated fine tuning slug.

While there are presently a total of 70 UHF channels, it should be recognized that any UHF channel in a specified geographic area is spaced from any other channel in that area by a three-channel bandwidth. This fact makes it possible substantially to reduce the number of channel selections which the tuner must be capable of receiving at any given location. However, to permit potential coverage of the entire UHF spectrum each tuning slug 52 is constructed to provide fine tuning adjustment over a three channel bandwidth.

Fine tuning of a selected detented channel is accomplished by adjustment of its associated fine tuning slug 52 to effect micrometric movement of the tuner shaft 20, through tilting movement of control shaft 26. The control shaft 26 is loosely journalled at its detented end in an extruded bearing (not shown) formed in the side of 60 of channel frame member 62. To accommodate tilting movement, the shaft 26 is cantilevered from tilt bearing 28 held in engagement with the face 64 of channel 62 by the reactive force developed by the spring loaded ball detent 46 acting against the crown detent plate 44. The face of the tilt bearing 28 which contacts face 64 of side 60 is tapered to restrict its radius of contact with the frame. This construction is desirable in order to reduce the force required to effect pivotation of shaft 26 about the frame bearing interface. The fine tuning end of shaft 26 is restrained only by a floating spacer link 66 (FIGURE 2) which encircles the control shaft 26 and is pivotally secured at its opposite end to tuner shaft 20. To delimit the rotation of control shaft 26, stop means in the form of tabs 67 are provided on the channel frame and detent gear. The slot 68 provided in the right hand (as viewed in FIGURE 3) flange of the channel frame 62 also serves to prevent overtravel of shaft 26. Link 66 ensures a fixed center-to-center spacing of the tuner and tilt shafts during tilting movement of the control shaft 26 keeping the anti-backlash and fine tuning gears in proper mesh at all times. The exact tilt of the control shaft 26 is controlled by the setting of the collar-engaged fine tuning slug 52. The operative slug is seated against the roller 54 by a spring 70 connected between the channel frame 62 and control shaft 26. In the embodiment shown, the spring is designed to produce a seating force of about 1 pound. Since the tilt of the shaft controls the angular position of the spacer link 66 about its tuner shaft bearing, and since the fine tuning gear 24 is locked against rotation by the detent plate 44, it follows that gear 24 will drive the anti-backlash gear 22 which undergoes micrometric rotation as a consequence of the tilt imparted to the control shaft 26. An important feature of the invention is the fact that the tuner shaft 20 can be roated not only by rotating the control shaft 26, under the control of the crown detent plate 44, but also by changing the tilt of the control shaft 26 by means of the presettable fine tuning slugs 52.

The fine tuning mode of operation is initiated by pulling out the operating knob 30 into the position shown in full lines in FIGURE 3. This action results in disengagement of the pin clutch 32–36, and in translation of the operating shaft 34, under control of snap spring 72, to a position placing the crown gear 74, through an idler gear 76, in engagement with pinion 78 provided on slug 52. The idler 76 is carried by a stabilizer bushing 80 loosely journalled on the inwardly projecting boss or shank 82 of crown gear 74, and is anchored against rotational movement by the button-hook positioning rod 84. With the pin clutch disengaged, rotation of the operating knob will result in radial adjustment of the fine tuning slug 52 without corresponding indexing of the detent plate 44. Force necessary to operate the fine tuning gear train, comprising gears 74, 76, and 78, is supplied through the flattened end 86 (FIGURE 2) of the operating shaft 34 and the fine tuning pressure spring 88. Spring 88 insures maintenance of proper gear engagement despite the motion of the fine tuning slug along the axis of roller 54 caused by tilting movement of shaft 26.

The crown gear and idler gear should run together smoothly in order to preserve a good "detent feel" at the operating knob when fine tuning. The idler gear should be as large in diameter as possible without interfering with adjacent fine-tuning-slug gears, in order to obtain secure mounting of the idler positioning rod 84 in the stabilizer bushing 80. The idler gear is provided with a standoff ring 90 to receive the meshing pressure between the idler gear and fine tuning slug gear so that the teeth of pinion 78 will not wedge or bind with the teeth of idler 76 as the tuning slug moves along the axis of the roller during fine tuning. The crown gear 74 is effectively splined onto the flattened end 86 of the operating shaft 34 and is free to slide axially along the shaft under the influence of the fine tuning pressure spring 88. As previously noted, the stabilizer bushing 80 rides freely on the shank 92 of crown gear 74 and acts as the carrier and spacing element for idler gear 76. A double "D" washer 94 prevents drift of the bushing 80 during coarse tuning by seating against the shoulder formed at the junction between the round portion of the operating shaft 34 and the flattened portion 86, to insure that the idler will not interfere with the tuning slugs.

One preferred construction of the slug-carrying wheel assembly 58, is shown in FIGURE 2. The slugs 52 are resiliently held against a supporting wheel 96 by means of an edge-serrated, copper, pressure plate 98. This plate in turn is locked in placed by means of a back-up plate 100 and secured to the assembly by nut 102. The wheel 96 is provided with three concentric ridges 104, 106 and 108 the central one of which, 106, is provided with tapped grooves 110 adapted to receive the centrally threaded portion 112 of each of the tuning slugs 52. The inner and outer ridges are smoothly grooved, as at 114, to receive the unthreaded portions 116 of the slug. The construction is such as to prevent passage of the protruding threaded portion of the slugs therethrough, thereby trapping them within the wheel assembly and preventing their removal except by dismantling of the assembly. This arrangement permits the slug to free-wheel when its centrally threaded portion overrides the mating threaded portion of the medial ridge. To insure restarting of the tuning slug when rotated into its fully seated position, such, for example, as the position of the slug shown at location 118, there is provided a resilient puck 120 which supplies end pressure to the slug to initiate engagement of the threads on rotation of the slug in the opposite direction. When the tuning slug is in its fully extended position, as at 122, the force necessary for reengagement is provided by the reactive force developed between the roller 54 and mating slug 52, as a result of the pressure produced by spring 70. The puck material should resist taking a compression set with age in the event a slug remains retracted for an extended period of time. Each end of the threaded portion of the slug is chamfered to enable the slugs to restart themselves after inadvertent overtravel. Slugs made of a suitable material such, for example, as the plastic material known as Delrin, have provided satisfactory performance and have survived life tests involving 100,000 operations in each direction without breaking or being permanently bent.

Figure 4:
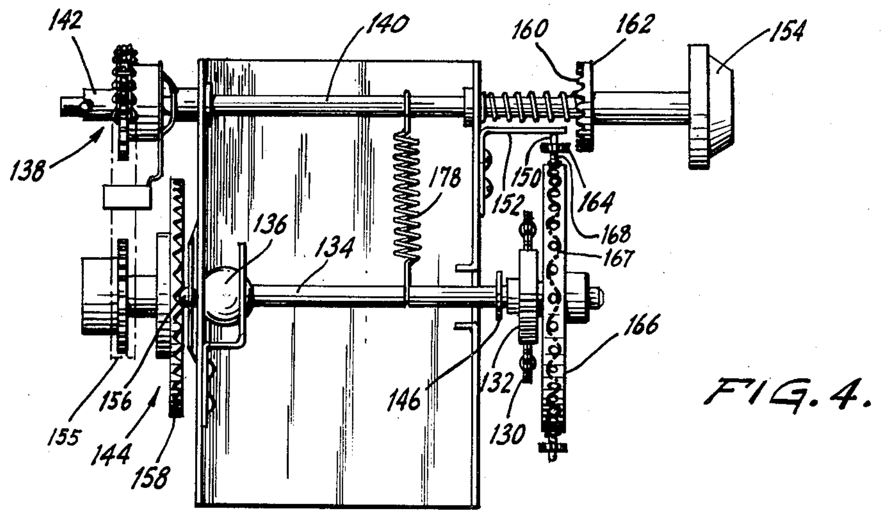
FIGURES 4 and 5 show alternate embodiments of the invention.
Figure 5:
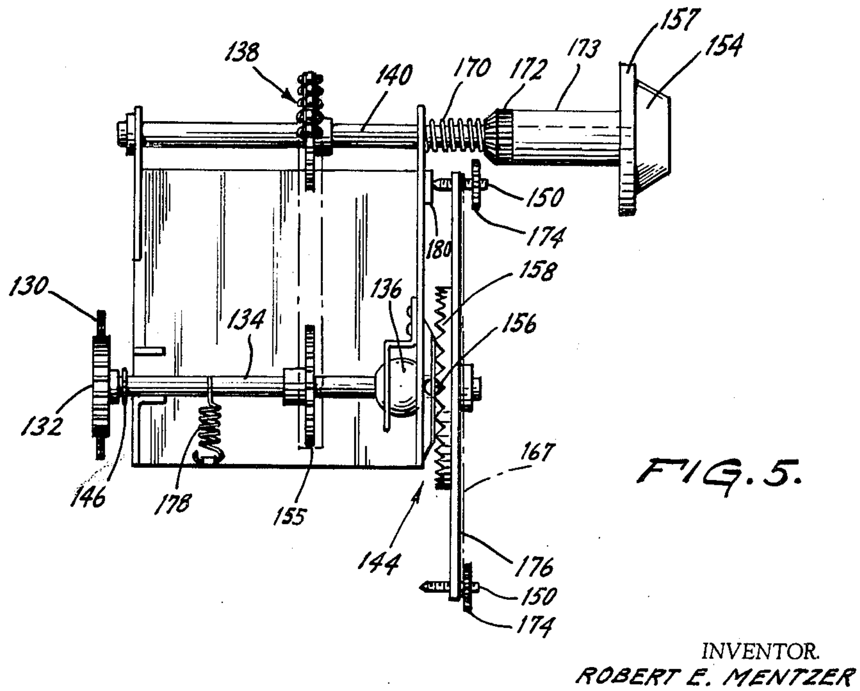

FIGURES 4 and 5 illustrate alternative constructions of tuning mechanism embodying features of the present invention. To facilitate description, parts having identity of function have been similarly numbered. In each of the illustrated mechanisms, anti-backlash gears 130 are installed on the rotatably tunable shaft of the device being tuned, here assumed to be a UHF tuner (not shown), the angular position of which determines the UHF channel being received. Meshing with the gear 130 is a pinion 132 carried by the tuning shaft 134. The tuning shafts 134, in each of the illustrated mechanisms are further provided with means permitting their pivotation about a ball and socket bearing 136 as well as means allowing for their rotation in the normal fashion.

As previously mentioned tuning is brought about by a composition of these motions, the tuning mechanism utilizing principles of this invention, being simpler, more compact and having a higher order of stability than prior art tuning devices. Referring more particularly to FIGURE 4, coarse tuning is accomplished through a chain drive 138 running from operating shaft 140 through pin-clutch 142 to tuning shaft 134. The tuning shaft 134 is provided with a detent assembly 144 similar to that previously described. To accommodate tilting movement the shaft 134 is supported at one end by a ball and socket bearing 136, and encircled at the other end by a free-floating tie bar bearing 146 pivoted about the tuner shaft not shown. The tie bar bearing, as in the mechanism illustrated in FIGURE 2, insures that the center-to-center spacing of the tuner and tuning shafts remains fixed. In the event a gear drive is used to couple these shafts the tie bar maintains the gears in mesh despite tilting movement of the tuning shaft. The chain drive 138, or other suitable drive means, is used and positioned with respect to the ball and socket bearing 136 so that the tension generated during its operation lifts the tuning shaft 134 in a direction allowing the tuning slugs 150, only two of which are shown for simplicity of illustration, to clear the stop 152 to facilitate indexing the fine tuning slugs past the interfering stop 152. This effect is obtained regardless of the direction of rotation imparted to the operating knob 154. To minimize the effect of tuning-shaft tilt on the detent mechanism the detent ball 156 is oriented so that its point of engagement with the detent wheel 158 is desirably at right angles to the direction of tilt.

Coarse tuning is effected by rotation of knob 154 fixedly secured to operating shaft 140. When the knob is rotated, the drive chain 138 will be engaged causing rotation of sprocket wheel 155. This action results in rotation of the pinion 132 secured to tuning shaft 134 driving the anti-backlash gear 130. When coarse tuning has been accomplished, fine tuning is initiated by depressing knob 154 which acts to disengage the pin clutch 142 and place the teeth 160 of crown gear 162, carried by knob 154, into engagement with slug gear 164. As the fine tuning slug is rotatively screwed into or out of slug wheel 166 the tuning shaft 134 on which the wheel 166 is fixedly secured is caused to tilt a proportional amount. To lock the slugs in their adjusted position they are restrained by a spring wire 167 laced between them. The slug wheel 166 shown in FIGURE 4 consists simply of a disc of aluminum edge-tapped at spaced intervals to accommodate the threaded end portion 168 of the mating tuning slug. Since the fine-tuning-slug mounting plate is detentably locked against rotation by the detent assembly 144, tilting movement of the tuning shaft will be translated, through pinion 132, into rotational movement of the anti-backlash gear 130 causing micrometric adjustment of the tuner. As previously pointed out the tie bar 146 maintains a fixed center-to-center spacing of the tuner and tuning shafts insuring their proper interengagement at all times.

The coarse tuning operation of the mechanism shown in FIGURE 5 operates in the same manner as the mechanism just described, the coarse tuning knob 154 being directly coupled to the operating shaft 140 which carries the sprocket-chain drive 138. The fine tuning knob 157 is freely journalled on the operating shaft 140 and conveniently mounted concentrically with coarse tuning knob 154. A spring 170 acts resiliently to urge the fine tuning knob 157 into an inoperative position on completion of the fine tuning operation and release of the fine tuning knob.

Depressing knob 157 results in engaging the gear 172, carried by the knob extension 173, with the pinion 174 of the fine tuning slug 150. Rotation of the engaged fine tuning knob, acting through pinion 174 causes rotation of the tuning slug in the threaded seat provided in wheel 176. Spring 178, acting in cooperation with the stop 180, translates this motion into tilting movement of the tuning shaft 134.

The mechanism shown in FIGURE 4 differs from that shown in FIGURE 5 in providing an arrangement wherein the tilting force, acting through the slug wheel 166, impinges directly on the tuning shaft 134 whereas in the arrangement illustrated in FIGURE 5, the force acts through a substantial moment arm. This latter arrangement provides somewhat less stable operation than the mechanism depicted in FIGURE 4.

As to each embodiment, an essential feature of the invention is the provision of shaft means adapted for tuning a rotatably tunable channel selector, which means are constructed and arranged to effect tuning by a combination of both the rotative and translational movements of said shaft means.

By making the final tuning position of the device being tuned the function of two independent movements of a single shaft means, the tuning mechanism may be made extremely compact and reliable, one movement being used for achieving detented coarse tuning and the other for achieving presettable fine tuning.

Once the fine tuning slugs have been set, the tuner can thereafter be accurately detentably tuned simply by rotating the coarse tuning knob to the appropriate channel selection. In the event of movement from one geographic area to another, the preset slugs may be simply realigned in the manner above described.

In summary there is provided unique tuning mechanism for achieving detentable and presettable fine tuning which is compact, reliable, and which provides improved precision of adjustment.

While preferred forms of the present invention have been depicted and described, it will be understood by those skilled in the art that the invention is susceptible of changes and modifications without departing from the essential concepts thereof, and that such changes and modifications are contemplated as come within the terms of the appended claims.

I claim:

1. In combination with rotationally adjustable shaft means, mechanism comprising:

(a) control shaft means mounted for independent tilting and rotational movements;

(b) means coupling said control shaft means to said adjustable shaft means in such manner that tilting and rotational movements of said control shaft means cause rotational movement of said adjustable shaft means;

(c) detent means connected to said control shaft means defining a plurality of individual detent stations each corresponding to an angular increment of the total arc of revolution through which said control shaft means is rotatable;
(d) means for driving said control shaft means progressively through said detent stations; and
(e) means selectively operable to tilt said control shaft means to effect, through the intermediation of said coupling means, micrometric rotational movement of said device through a positional range corresponding to a small arc of the total rotative motion through which said adjustable shaft means is rotatable, said selectively operable means being presettable to insure the establishment of a predetermined tilt attitude of said control shaft means on return thereof to a particular detent station and consequent return of said adjustable shaft means to a predetermined angular position.

2. In combination with a rotatably adjustable tuner, tuning mechanism comprising:
(a) control shaft means mounted for independent tilting and rotational movements;
(b) means coupling said control shaft means to said tuner such that rotational and tilting movements of said control shaft means cause rotational adjustment of said tuner;
(c) detent means associated with said control shaft means defining a plurality of individual detent stations each corresponding to an angular increment of the total arc of revolution through which said control shaft means is rotatable;
(d) means for effecting rotational movement of said control shaft means progressively through said detent stations for coarse tuning said tuner;
(e) means for tilting said control shaft means including an assembly carried by the tiltable end of said control shaft means provided with a plurality of selectively adjustable, radially translatable elements;
(f) abutment means against which said elements are successively and individually brought into contact during rotational movement of said control shaft means;
(g) means resiliently urging said control shaft means towards said abutment means and for seating a predetermined one of said translatable elements against said abutment means on rotational movement of said control shaft means into a detent station; and
(h) means for radially adjusting a detent-positioned element to effect tilt of said control shaft means through a predetermined positional range effective, through the intermediation of said coupling means, to fine tune said tuner to a desired channel.

3. In combination:
(a) a rotatably adjustable tuner;
(b) control shaft means mounted for both tilting and rotational movements;
(c) means coupling said control shaft means to said tuner;
(d) detent means connected to said control shaft means defining a plurality of individual detent stations each corresponding to an angular increment of the total arc of revolution through which said control shaft means is rotatable;
(e) means for effecting rotational movement of said control shaft means progressively through said detent stations and operable through the intermediation of said coupling means to coarse tune said tuner;
(f) means for adjusting the tilt of said control shaft means including an assembly mounted on said control shaft means containing a plurality of selectively adjustable, radially translatable elements threadedly received in said member individual ones of which are operatively associated with individual ones of said detent stations;
(g) tiltably-fixed means against which said elements are individually and successively brought into abutment on rotational advance of said control shaft means from one detent station to the next;
(h) means for resiliently urging the translatable element operatively associated with a given detent station into abutment with said tiltably-fixed means on rotational advance of said control shaft means into that detent station; and
(i) means for radially adjusting said detent-positioned element to effect tilt of said control shaft means through a positional range effective, through the intermediation of said coupling means, rotatably to fine tune said tuner.

4. In combination:
(a) a rotatably adjustable tuner;
(b) rotationally operable means translatable into first and second operating positions;
(c) control shaft means mounted for independent tilting and rotational movements;
(d) detent means connected to said control shaft means defining a plurality of individual detent stations each corresponding to an angular increment of the total arc of revolution through which said control shaft means is rotatable;
(e) means intercoupling said control shaft means and said rotationally operable means to cause advance of said control shaft means progressively through said detent stations on rotation of said rotationally operable means when translated into said first operating position;
(f) means for adjusting the tilt of said control shaft means comprising a fine-tuning-slug wheel mounted on said control shaft means for rotational movement therewith, and having received therein, at spaced intervals a plurality of adjustable slugs;
(g) means operable to provide, on translation of said rotationally operable means into said second operating position and on rotation thereof, adjustment of said tilt-adjustment means to effect tilt of said control shaft means; and
(h) means coupling said control shaft means to said tuner in such manner that rotational and tilting movements of said control shaft means respectively produce coarse and fine rotational adjustment of said tuner.

5. In combination:
(a) a rotatably adjustable tuner;
(b) rotationally operable means translatable into first and second operating positions;
(c) control shaft means mounted for tilting and rotational movements;
(d) detent means connected to said control shaft means defining a plurality of individual detent stations each corresponding to an angular increment of the total arc of revolution through which said control shaft means is rotatable;
(e) means intercoupling said control and operating shaft means to provide, on translation of said operating shaft means into a first position and on rotation thereof, coarse rotational adjustment of said control shaft means;
(f) means for adjusting the tilt of said control shaft means comprising a wheel assembly carried by said control shaft means, for rotation therewith, and having threadedly received therein at spaced intervals a plurality of adjustable slugs, and including a fixed element against which said slugs are individually and successively brought into abutment on indexing of said control shaft means into a detent station;
(g) means operable on translation of said operating shaft means into a second position and on rotation thereof, to provide adjustment of said slugs to effect tilting movement of said control shaft means; and
(h) means coupling said control shaft means to said tuner in such manner that rotational and tilting movements of said control shaft means respectively produces coarse and fine rotational adjustment of said tuner.

6. In combination:

(a) a rotatably adjustable tuner;

(b) operating shaft means mounted for both translational and rotational movements;

(c) control shaft means mounted for independent tilting and rotational movements;

(d) detent means connected to said control shaft means defining a plurality of individual detent stations each corresponding to an angular increment of the total arc of revolution through which said shaft is rotatable;

(e) means intercoupling said control and operating shaft means to cause advance of said control shaft means progressively through said detent stations;

(f) means for adjusting the tilt of said control shaft means comprising a wheel assembly mounted on said control shaft means for rotational movement therewith, and having threadedly received therein, at spaced intervals, a plurality of transversely adjustable slugs;

(g) control knob means operable to adjust said slugs to effect tilt of said control shaft means; and (h) means for translating the rotational and tilting movement of said control shaft means into rotational adjustment of said tuner.

7. Mechanism in accordance with claim 1, further characterized in that said selectively operable means comprises a wheel assembly mounted to said control shaft means for rotation therewith, said assembly including selectively adjustable, translatable elements threadedly received in said member for movement transverse to the plane of said wheel assembly, said means for achieving tilt further comprising a fixture against which said elements can be brought into abutment to produce a reactive force, acting through the moment arm provided by said wheel assembly, effects tilting movement of said control shaft means.

References Cited by the Examiner

UNITED STATES PATENTS 2,381,227 8/45 Richards -------------- 74—10.41

BROUGHTON G. DURHAM, *Primary Examiner.*

MILTON KAUFMAN, *Examiner.*